(12) United States Patent
Yuyama et al.

(10) Patent No.: US 6,843,307 B2
(45) Date of Patent: Jan. 18, 2005

(54) HEAT PIPE UNIT AND HEAT PIPE TYPE HEAT EXCHANGER

(75) Inventors: Takaharu Yuyama, Sunto-gun (JP); Masakazu Nakanishi, Susono (JP)

(73) Assignees: Mitsubishi Aluminum Co., Ltd., Tokyo (JP); MA Fabtec Co., Ltd., Tokyo (JP)

( * ) Notice: Subject to any disclaimer, the term of this patent is extended or adjusted under 35 U.S.C. 154(b) by 0 days.

(21) Appl. No.: 10/628,360

(22) Filed: Jul. 29, 2003

(65) Prior Publication Data

US 2004/0069461 A1 Apr. 15, 2004

(30) Foreign Application Priority Data

Aug. 2, 2002 (JP) ........................................ 2002-226634
Jun. 11, 2003 (JP) ........................................ 2003-166557

(51) Int. Cl.[7] .............................................. F28D 15/00
(52) U.S. Cl. ............................. 165/104.26; 165/104.33; 165/104.21; 361/700; 174/15.2; 257/715
(58) Field of Search ....................... 165/104.21, 104.26, 165/104.33, 185; 361/700; 174/15.2; 257/714–716

(56) References Cited

U.S. PATENT DOCUMENTS

| | | | | | |
|---|---|---|---|---|---|
| 2,024,716 | A | * | 12/1935 | Brown | 165/47 |
| 4,145,708 | A | * | 3/1979 | Ferro et al. | 257/715 |
| 4,541,261 | A | * | 9/1985 | Yanadori et al. | 72/112 |
| 5,329,993 | A | * | 7/1994 | Ettehadieh | 165/104.14 |
| 5,632,158 | A | * | 5/1997 | Tajima | 62/259.2 |
| 5,651,414 | A | * | 7/1997 | Suzuki et al. | 165/104.14 |
| 6,237,223 | B1 | * | 5/2001 | McCullough | 29/890.032 |
| 6,257,323 | B1 | * | 7/2001 | Kuo | 165/104.21 |
| 6,490,160 | B2 | * | 12/2002 | Dibene et al. | 361/700 |

FOREIGN PATENT DOCUMENTS

| | | | | |
|---|---|---|---|---|
| GB | 2006950 | * | 5/1979 | 165/104.26 |
| JP | 52-04441 | * | 4/1977 | 165/104.21 |
| JP | 57-041591 | * | 3/1982 | 165/104.33 |

* cited by examiner

*Primary Examiner*—Terrell Mckinnon
(74) *Attorney, Agent, or Firm*—Oblon, Spivak, McClelland, Maier & Neustadt, P.C.

(57) ABSTRACT

A heat pipe unit is comprised of a tank, a plurality of pipes provided upright on and joined to a side of the tank to be in communication with the tank, the pipes being closed at an end thereof opposite an end where the pipes are joined to the tank; a working fluid sealed in the tank and movable between the plurality of pipes and the tank, and a plurality of fins fitted over and assembled to the plurality of pipes. The tank of this heat pipe unit is embedded in a base block of metal to provide a heat pipe type heat exchanger. A plurality of heat pipe units may be arranged in a row on the base block. The tank is preferably formed from a pipe of circular cross section and has spiral grooves provided on an inner surface thereof. The heat pipe unit and the heat pipe type heat exchanger are simple in structure and excellent in cooling performance, and are easy to produce.

17 Claims, 12 Drawing Sheets

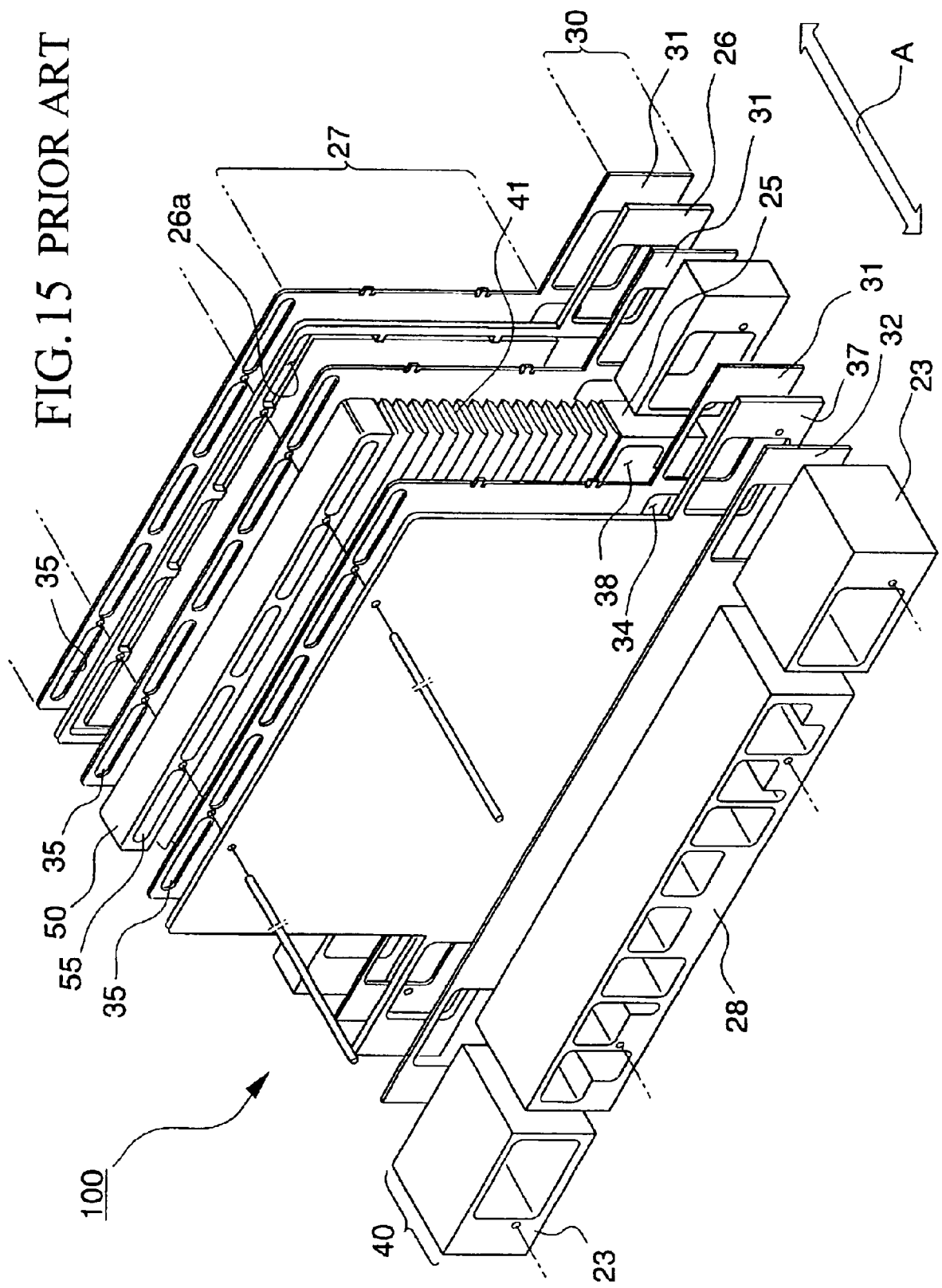

HEAT PIPE UNIT AND HEAT PIPE TYPE HEAT EXCHANGER

BACKGROUND OF THE INVENTION

1. Field of the Invention

The present invention relates to a heat pipe type heat exchanger for use in cooling, for example, semiconductor devices and the like.

2. Description of the Related Art

Heat pipe type heat exchangers are widely used to cool control devices that utilize a semiconductor device such as a power transistor or vehicle-mounted transistor, or thyristor.

As shown in FIG. 14, a conventional heat pipe type heat exchanger 20 is made up of a heat receiver block 21 that receives heat from an exothermic body, a plurality of heat pipes 13 having their base portions embedded in the heat receiver block 21 at a predetermined spacing, and an intermediate partition plate 18, fins 24 and a guide 17 that are assembled in sequence to the exposed portions of the heat pipes 13 from the base portions toward the top. The fins 24 dissipate heat from the heat pipes 13, and the intermediate partition plate 18 serves to divide the casing containing a semiconductor device (not shown) such as a thyristor and the like and the outside, while at the same time serving, along with the guide 17, to fasten the heat pipes 13 to one another. The heat receiver block 21 and the fins 24 are formed from a material with good thermal conductivity such as copper, aluminum or the like.

Such a heat pipe type heat exchanger is disclosed for example in Japanese Patent Application Unexamined Publication No. Hei 8-210789 (FIG. 4) and has features such as light weight, compactness, low maintenance and the like.

In recent years, as semiconductor devices have developed and come into wide use, the necessity has arisen of cooling semiconductor devices with larger heating values. Heat exchangers are generally used based on required capacities, i.e., heat sinks for a small capacity, heat pipes for an intermediate capacity, and thermosyphon type heat exchangers for a large capacity.

Shown in FIG. 15 is an example of a thermosyphon type heat exchanger. FIG. 15 is a partial exploded perspective view of a thermosyphon type heat exchanger 100, with components shown exploded. The thermosyphon type heat exchanger 100 roughly has a shape of two rectangular parallelepipeds placed one on the other and is comprised of a substantially rectangular parallelepiped condenser section 27, a substantially rectangular parallelepiped tank section 30 disposed below the condenser section 27, and a substantially rectangular parallelepiped front apron section 40 extending forwardly in the back-and-forth direction indicated by a double-headed arrow A.

The condenser section 27 is constituted by a partition plate 31, a combination of fins 41 and a header 50, a partition plate 31, a frame body 26 and a partition plate 31 laminated in this order in the back-and-forth direction indicated by the double-headed arrow A and joined together, with an end plate 37 joined to the front end. The condenser section 27 thus includes many rectangular spaces 26a defined by the frame body 26 and the two partition plates 31, 31 that hold the frame body 26 therebetween as well as many fins 41. To increase the heat dissipation action, the fins 41 are held between the two partition walls 31, 31. Furthermore, at the top end, there are formed a plurality of paths that allow flow therethrough of working fluid in gaseous phase, the plurality of paths being defined by a plurality of vapor paths 55 provided in the header 50, a plurality of vapor paths 35 provided in each partition plate 31, and the plurality of rectangular spaces 26a.

The tank section 30 has therein the partition plate 31, a tank segment 25, the partition plate 31, the frame body 26 and the partition plate 31 joined together in this order in the back-and-forth direction such that working fluid paths 38 provided in the tank segment 25 align with corresponding liquid paths 34 provided in each partition plate 31, with an end plate 32 joined at the front end. The tank section 30 is thus formed with a plurality of liquid receivers, which partially open upwardly to receive working fluid in the liquid phase. An exothermic body (not shown) is connected to the underside of the tank section 30.

The front apron section 40 is made up of an end segment 28 and two corner segments 23, 23 and is primarily used to attach the thermosyphon type heat exchanger 100.

By the construction as mentioned above, a larger heat exchange area has been secured to enhance the cooling performance (see for example Japanese Patent Application Unexamined Publication No. 2002-13467 (FIG. 1)).

The large capacity thermosyphon type heat exchanger is excellent in performance, but is complicated in structure as indicated in FIG. 15 and thus is costly. To secure the same performance as obtained by the thermosyphon type heat exchanger with the conventional heat pipe type heat exchanger, which is simpler in structure than the thermosyphon type heat exchanger, many heat pipes would be required, eventually resulting in an increase in cost due to enlargement of the heat exchanger size, production difficulties and the like.

SUMMARY OF THE INVENTION

The present invention has been made under such circumstances, and accordingly, it is an object of the present invention to provide a heat pipe unit and a heat pipe type heat exchanger which are simple in structure and easy to produce, and which have an improved thermal efficiency for its compact size.

In order to attain the above object, according to an aspect of the present invention, there is provided a heat pipe unit comprising: a tank; a plurality of pipes provided upstanding on and joined to a side of the tank to be in communication with the tank, the plurality of pipes being closed at an end thereof opposite an end where the plurality of pipes are joined to the tank; a working fluid sealed in the tank and movable between the plurality of pipes and the tank, and a plurality of fins each provided on the plurality of pipes.

By thus integrally coupling the thin pipes to one another with the tank, the cooling efficiency on the fins side will be improved, thereby to realize an improved cooling efficiency of the entire heat pipe type heat exchanger.

Preferably, the tank comprises a pipe of circular cross section and is provided with a groove on an inner surface thereof. Preferably, the groove has a depth of 0.01 to 0.5 mm and a pitch of 4 mm or less.

By thus providing a groove inside the tank, the area of the heat-transfer surface is enlarged, leading to a better heat exchange efficiency.

According to another aspect of the present invention, there is provided a heat pipe type heat exchanger comprising: a tank; a plurality of pipes provided upstanding on and joined to a side of the tank to be in communication with the tank, the plurality of pipes being closed at an end thereof opposite an end where the plurality of pipes are joined to the tank; a working fluid sealed in the tank and movable between the plurality of pipes and the tank; a base block of metal having the tank embedded therein; and a plurality of fins each provided on the plurality of pipes.

Preferably, the tank comprises a pipe of circular cross section and is provided on an inner surface thereof with a groove. Preferably, the groove has a depth of 0.01 to 0.5 mm and a pitch of 4 mm or less.

With the thus constructed heat pipe type heat exchanger, the heat generated at a semiconductor device is transferred to the base block having good thermal conductivity, distributed uniformly inside the base block, and dissipated into the atmosphere by way of the plurality of thin pipes, making it possible to realize an improved heat exchange performance for the small size of the heat pipe type heat exchanger.

Especially when a pipe that has a large cross-sectional area and a groove formed on its inner surface is used to constitute the tank, an increase is made in the contact area between the working fluid and the tank, thereby to enable easier transfer of heat from the tank and enhancement of the heat exchange performance.

According to a further aspect of the present invention, there is provided a heat pipe type heat exchanger comprising: a plurality of tanks; a plurality of pipes provided upstanding on and joined to a side of each of the tanks to be in communication with a corresponding one of the tanks, the plurality of pipes being closed at an end thereof opposite an end where the plurality of pipes are joined to the corresponding one of the tanks; a Working fluid sealed in each of the tanks and movable between the plurality of pipes and the corresponding one of the tanks; a base block of metal having the plurality of tanks embedded therein; and a plurality of fins provided on at least some of the plurality of pipes of one or more of the plurality of tanks.

By embedding a plurality of heat pipe units in juxtaposition in the base block, an increase is made in the heat exchange area, and besides, by such a structure, it becomes possible to increase the cooling capability as required. Juxtaposition of many heat pipe units insofar as room therefor is available, allows for a large capacity semiconductor device to be efficiently cooled, such that stable operation of the semiconductor device is guaranteed.

In this case as well, each of the plurality of tanks preferably comprises a pipe of circular cross section and is provided with a groove having a depth of 0.01 to 0.5 mm and a pitch of 4 mm or less on its inner surface. In this way, an increase is made in the contact area between the working fluid and the tanks, so as to enable easier transfer of heat from the tanks and enhancement of the heat exchange performance.

Advantageously, where a plurality of heat pipe units are juxtaposed, the plurality of pipes of the plurality of tanks are arranged in a grid-like or a staggered manner in top view.

Especially when two or more types of heat pipe units are employed that have the thin pipes at different positions and are disposed such that their thin pipes form a staggered arrangement in top view, the cooling efficiency will be more enhanced than with the thin pipes forming a grid-like arrangement.

Advantageously, the tank or each of the tanks is secured to the base block with mounting hardware.

Allowing for a heat pipe type heat exchanger to be used to cool a vehicle-mounted semiconductor device, it is preferable that the tank or the tanks are screwed to the base block with mounting hardware.

By thus securing the tank or tanks to the base block with mounting hardware, a vehicle-mounted heat pipe type heat exchanger will be obtained that withstands vigorous vibrations during the running of the vehicle.

According to yet another aspect of the present invention, there is provided a heat pipe type heat exchanger comprising: a tank; a plurality of pipes provided upstanding on and joined to a side of the tank to be in communication with the tank, the plurality of pipes being closed at an end thereof opposite an end where the plurality of pipes are joined to the tank; a working fluid sealed in the tank and movable between the plurality of pipes and the tank; a base block of metal having the tank embedded therein; and a plurality of fins each provided on the plurality of pipes, wherein the plurality of pipes are angled relative to the base block such that when the base block is mounted vertically, the plurality of pipes extend at an angle of 5 to 10° relative to a horizontal plane.

A control device that utilizes a semiconductor device is used as an attachment for various machines and apparatuses, and as such, there are often restrictions on the location for mounting the control device as well as the direction in which to mount the control device. Consequently, to install a heat pipe type heat exchanger, the base block having the tank embedded therein must often be mounted vertically, with the pipes preferably extending sideways at an angle of 5 to 10° relative to the horizontal plane. The inclination of the pipes is to make it easier for the working fluid inside the pipes to flow into the tank.

The above and other objects and features of the present invention will become more apparent from the following description taken in conjunction with the accompanying drawings.

BRIEF DESCRIPTION OF THE DRAWINGS

FIG. 15 is a perspective view of a structural example of a conventional thermosyphon type heat exchanger.

DESCRIPTION OF THE PREFERRED EMBODIMENTS

Embodiments of the present invention will now be described with reference to the attached drawings.

Figure 1:
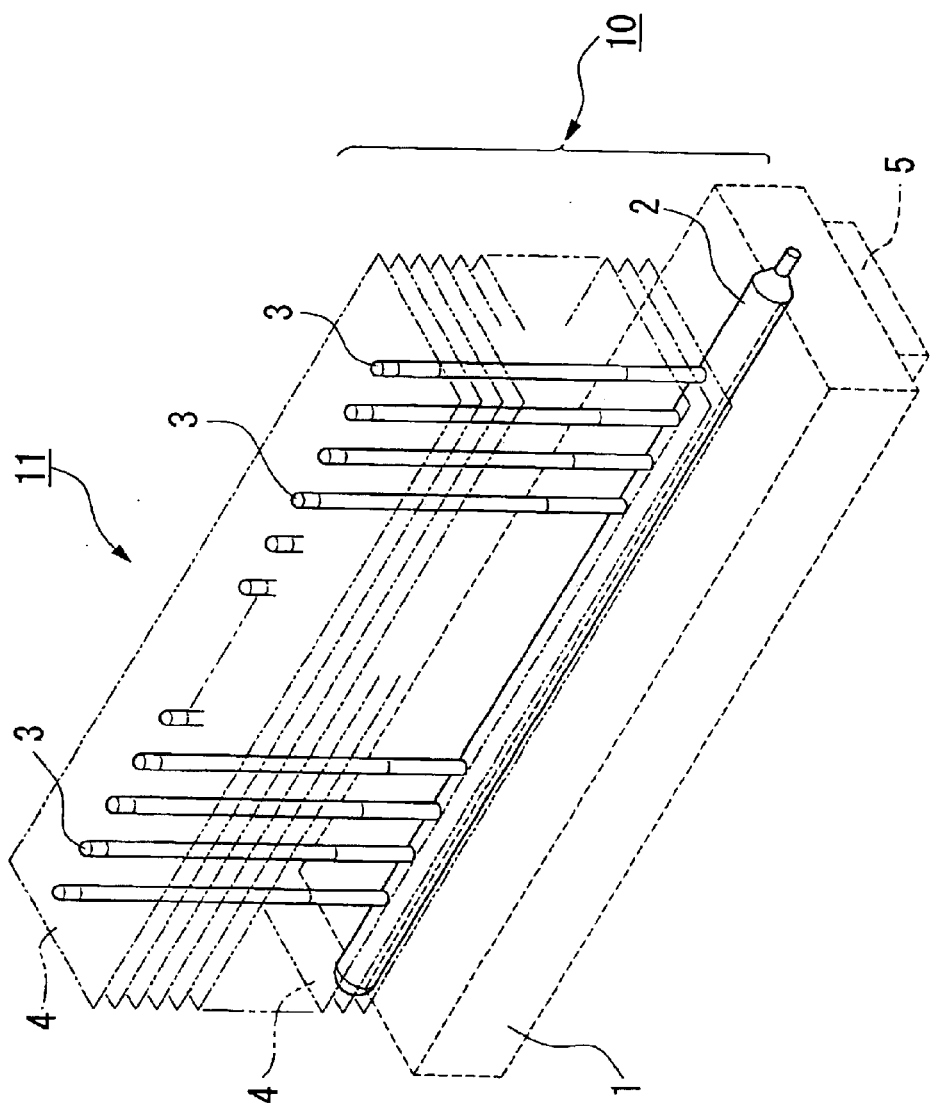
FIG. 1 is a perspective view of a heat pipe unit and a heat pipe type heat exchanger according to a first embodiment of the present invention.

FIG. 1 is a perspective view of a heat pipe unit and a heat pipe type heat exchanger according to a first embodiment of the present invention.

A heat pipe unit 10 of this embodiment is comprised of a tank 2 of circular cross section, a plurality of thin or small-diameter pipes 3 provided upstanding on the tank 2 to be in communication with the tank 2, and thin-plate fins 4 formed from a material of good thermal conductivity such as aluminum or copper, each fin arranged on the thin pipes 3 in spaced relations. Each fin 4 may be provided on the thin pipes 3 by, for example, providing holes in advance in each fin at predetermined positions through burring and press-fitting the fin 4 over the pipes 3 at the holes. Alternatively, each pipe 3 may be enlarged in diameter at positions for assembly thereto of the fins 4.

In the first embodiment as shown in FIG. 1, the thin pipes 3 are arranged in a row with a suitable spacing therebetween. The tank 2 and each pipe 3 are joined together through brazing to provide an integral interior space. Each pipe and the tank are closed through welding at their ends to hermetically seal a working fluid such as water, (per) fluorocarbon or the like.

Furthermore, in a heat pipe type heat exchanger 11 of this embodiment, as shown by the broken lines in FIG. 1, the tank 2 is embedded in and integrally joined through soldering or the like to a base block 1 which is formed from a metal such as aluminum, copper or the like having a good thermal conductivity and a large thermal capacity. Consequently, heat transfer between the base block 1 and the tank 2 is effected exceedingly smoothly.

An exothermic semiconductor device 5 is attached to a surface of the base block 1 opposite the surface where the tank 2 is buried in the base block 1.

With the thus constructed heat pipe type heat exchanger 11, the heat generated at the semiconductor device 5 is transferred to and then distributed over the base block 1 so as to enter the tank 2 and cause evaporation of the working fluid inside the tank 2. The working fluid evaporated rises inside the thin pipes 3 such that the heat is conducted to the fins 4 and released into the atmosphere. The working fluid that has risen inside the thin pipes 3, after releasing the heat, condenses to descend inside the thin pipes 3 to return to the tank 2.

The circulation of the working fluid as described above releases the heat generated at the semiconductor device 5 into the atmosphere, thereby to suppress a rise in the temperature of the semiconductor device 5 and allow the semiconductor device 5 to perform stably.

The use of the base block 1 in the above-mentioned manner enables heat to be conducted to each thin pipe 3, thereby to enhance the cooling capability.

Figure 2:
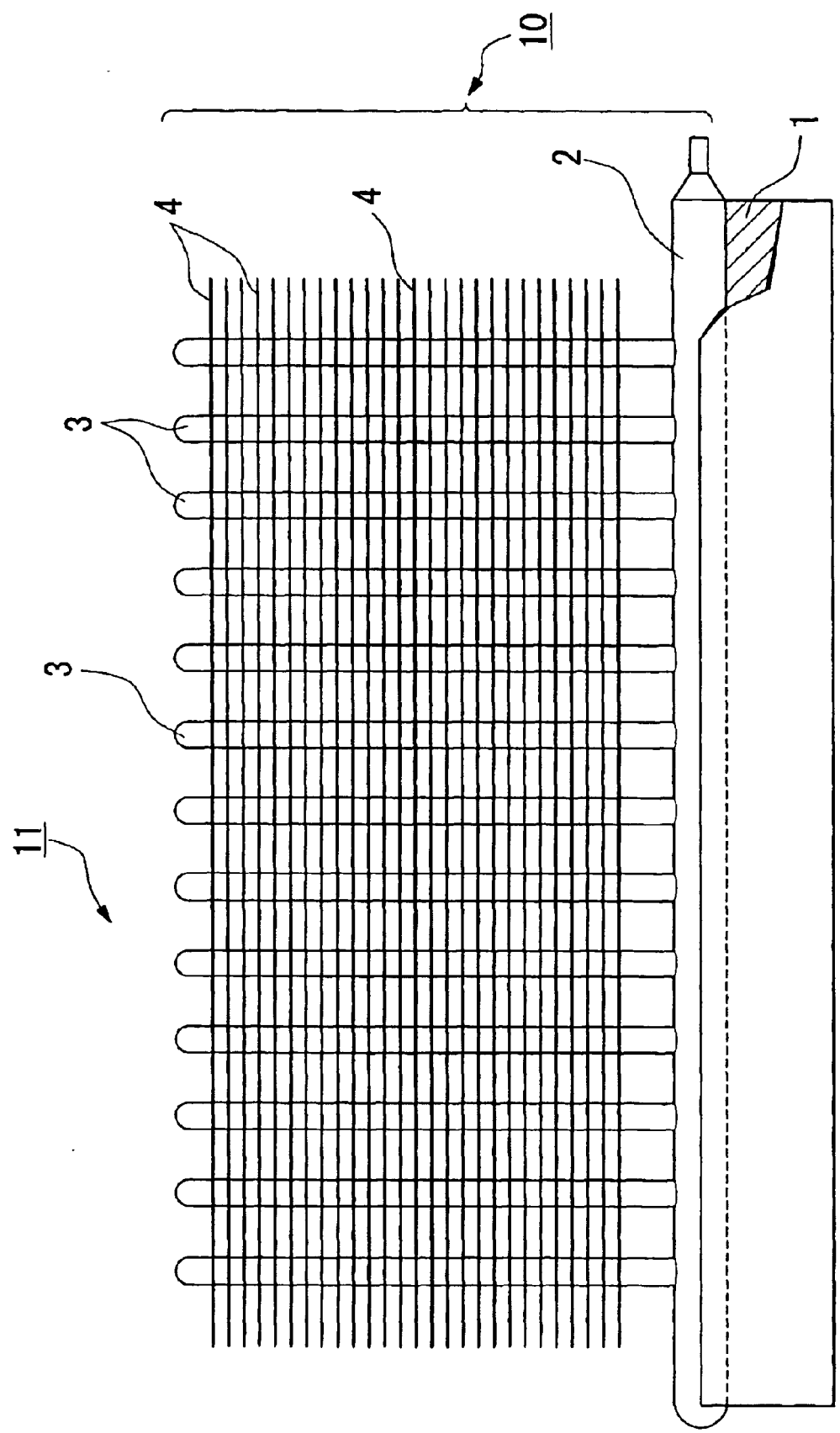
FIG. 2 is a partially cutaway side view of the heat pipe unit of the present invention as shown in FIG. 1.

FIG. 2 is a partially cutaway side view of the heat pipe type heat exchanger 11 of the present embodiment as shown in FIG. 1. The tank 2 of the heat pipe unit 10 is embedded in the base block 1 by one half of its height h, and the thin pipes 3 are upstanding in a row arrangement on top of the tank 2 at a predetermined spacing. A large number of thin fins 4 are provided so as to connect the thin pipes 3 to one another.

In the present embodiment, the shape in cross section of the tank as mentioned above may be circular or square. A tank of circular cross section has a high strength and is easily available, and advantageously leads to cutting costs. A tank of square cross section, when embedded in the base block, may increase the contact area between the tank and the base block to realize an improved cooling efficiency.

In either case, the tank and the base block are preferably joined together through soldering or the like. This is because a tight joint leads to better thermal conductivity and to an improved cooling efficiency.

Figure 3:
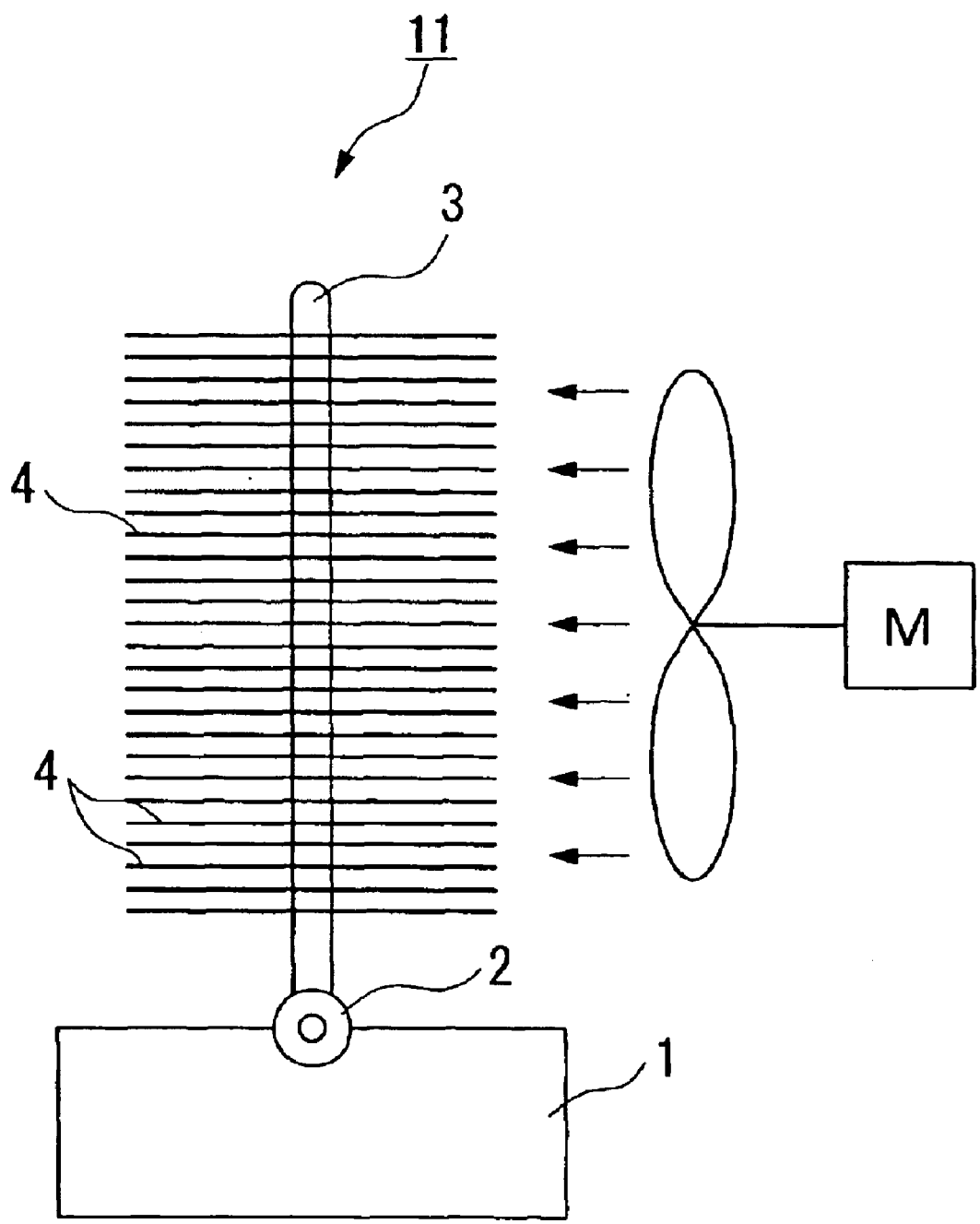
FIG. 3 is a view explaining the direction of blowing air against the heat pipe unit of the present invention as shown in FIG. 1.

FIG. 3 is a view illustrating the direction of air blowing for the heat pipe type heat exchanger of the present embodiment as shown in FIG. 1. A fan may be used to send air from a lateral direction of the fins 4 to effect forced cooling which may further enhance the cooling efficiency.

The above is the fundamental structure and operation of a heat pipe unit and a heat pipe type heat exchanger of the present invention.

Figure 4:
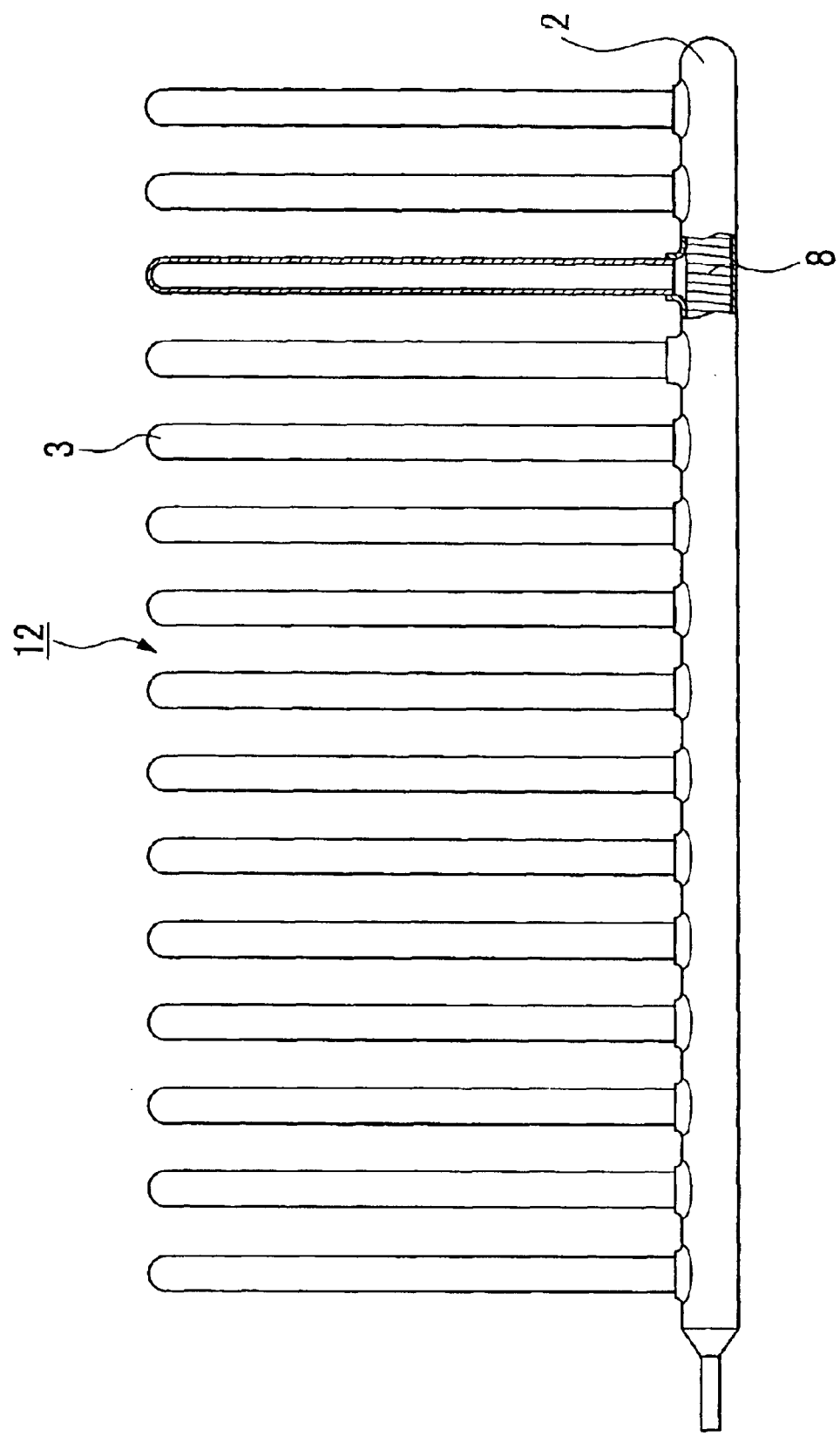
FIG. 4 is a partially cutaway side view of a heat pipe unit according to a second embodiment of the present invention.
Figure 5:
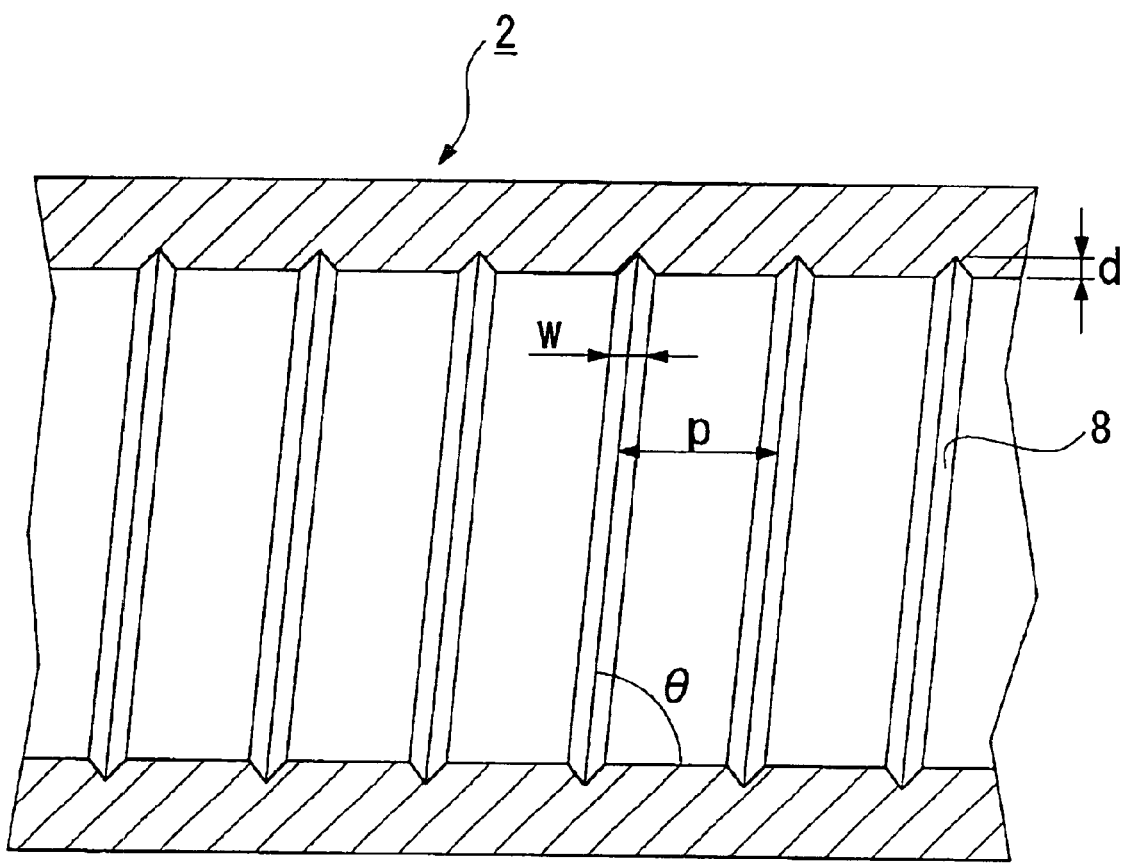
FIG. 5 is an enlarged view showing grooves inside a tank of the heat pipe unit as shown in FIG. 4.

FIG. 4 is a partially cutaway side view of a heat pipe unit according to a second embodiment of the present invention. A heat pipe unit 12 of the second embodiment differs from the heat pipe unit 10 of the first embodiment as shown in FIG. 2 in that the tank 2, which has a large cross-sectional area, is comprised of a pipe of circular cross section, and the pipe is provided on its inner surface with grooves 8 so as to enlarge the area of heat-transfer surface and perform heat exchange with an improved efficiency. Shown in FIG. 5 is an enlarged view of the inner surface of the tank 2. The inner surface of the tank 2 is formed, with a thread chaser, with grooves 8 in a spiral fashion having a depth d, width w and pitch p. θ indicates the inclination of the grooves 8 relative to the axis of the tank-constituting pipe.

It is to be noted, however, that, although in the present embodiment a pipe of circular cross section is employed as the pipe with a large cross-sectional area and has spiral grooves 8 formed on its inner surface, a pipe having a cross section other than a circular cross section such as a square cross section or the like may also be used. Likewise, the grooves are not limited to spiral ones and may be of any type such as straight grooves extending longitudinally along the pipe insofar as they are suited for the purpose of increasing the area of heat-transfer surface. From the viewpoint of the effect, however, spiral grooves are preferred. Furthermore, the grooves may be formed over all or part of the inner surface of the pipe with a large cross-sectional area.

To determine the optimum dimensions of the grooves 8, experiments were conducted in which changes were made in dimensions of the grooves 8 and thermal resistances were measured. In other words, a pipe of copper having an outer diameter of 22.22 mm and a wall thickness of 1.2 mm was employed as the tank 2 in FIG. 4, and pipes of copper having an outer diameter of 12.7 mm and a wall thickness of 1 mm were employed as the thin pipes 3. The lower half of the horizontal tank 2 is embedded in and soldered to an aluminum-made base block (not shown) that has a width of 70 mm, a length of 170 mm and a thickness of 20 mm. The fins (not shown) were formed from aluminum and had holes formed therethrough and were press-fitted over the thin pipes 3. The inner surface of the tank 2 was formed with a thread chasing tap with spiral grooves 8 having depths d, widths w, and pitches p as shown in Table 1 under Experiments Nos. 1–8 and 11. The same pipe but with straight grooves extending along its longitudinal direction was also used in Experiment No. 9. Furthermore, for comparison, the same pipe but with no grooves formed was used in Experiment No. 10.

With these heat exchanger models, a dummy heater was used to apply heat of 370 W to the base blocks, and thermal resistances (kelvin/watt: K/W) were measured. A water cooling jacket was attached to the thin pipe 3, and the thermal resistance was evaluated by how much of the heat applied to the base block was transferred to the water cooling jacket. The lower the thermal resistance, the higher the cooling efficiency. The results are shown both in Table 1 and FIG. 6.

with grooves and/or a mesh of metal as described above so as to enlarge the area of the heat-transfer surface.

Considering that the heat pipe type heat exchanger will have many uses for cooling vehicle-mounted semiconductor control devices, it is preferable that the tank is secured to the base block with mounting hardware.

Likewise, for the same reason, it is preferable that the thin pipes are secured to the base block with mounting hardware.

If the tank and the thin pipes are thus secured to the base block with mounting hardware, a vehicle-mounted heat pipe type heat exchanger will be provided which may withstand vigorous vibrations during running of the vehicle.

FIG. 7 shows an example of a method of securing the tank 2 to the base block 1, the tank 2 being constituted by a pipe having a circular cross section.

TABLE 1

| | Experiment No. | | | | | | | | | | |
|---|---|---|---|---|---|---|---|---|---|---|---|
| | 1 | 2 | 3 | 4 | 5 | 6 | 7 | 8 | 9 | 10 | 11 |
| Groove Type | Spiral | Spiral | Spiral | Spiral | Spiral | Spiral | Spiral | Spiral | Straight Longitudinally | No Grooves | Spiral |
| Groove Shape | Triangular | Triangular | Triangular | Triangular | Triangular | Triangular | Triangular | Triangular | Trapezoidal | — | Triangular |
| Pitch: p (mm) | 1.5 | 2.5 | 4 | 4 | 4 | 8 | 8 | 8 | 1.2 | — | 1 |
| Depth: d (mm) | 0.09 | 0.09 | 0.59 | 0.34 | 0.09 | 0.59 | 0.34 | 0.09 | 0.36 | — | 0.09 |
| Width: w (mm) | 0.18 | 0.18 | 1.18 | 0.68 | 0.18 | 1.18 | 0.68 | 0.18 | 0.84 | — | 0.18 |
| Angle: $\theta$ (°) | 85.67 | 82.81 | 78.59 | 78.59 | 78.59 | 68.02 | 68.02 | 21.98 | — | — | 85.67 |
| Thermal Resistance: R (K/W) | 0.0646 | 0.0654 | 0.0692 | 0.0695 | 0.0697 | 0.0743 | 0.0743 | 0.0746 | 0.0778 | 0.0908 | 0.0646 |

Figure 6:
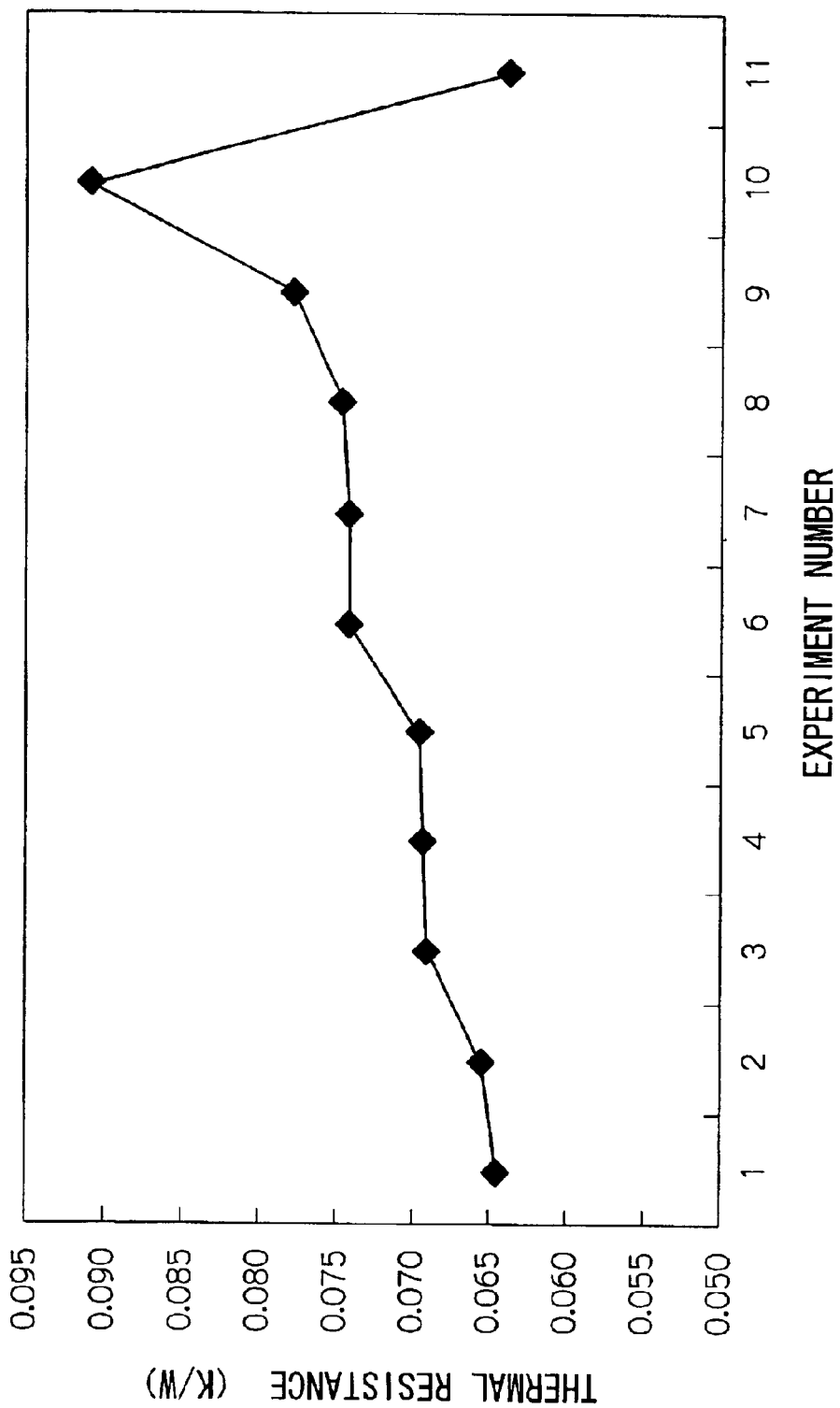
FIG. 6 is a view showing variations of thermal resistance obtained when changes are made in dimensions of the grooves.

As is apparent from the results in Table 1 and FIG. 6, Experiments Nos. 1 to 8 and 11 in which the pipes were internally provided with spiral grooves and Experiment No. 9 in which the pipe was provided with longitudinally-extending straight grooves, showed low thermal resistances as compared with Experiment No. 10 in which the pipe was provided with no grooves. The effects were remarkable especially when the grooves were spiral and had a pitch of 4 mm or less (see Experiments Nos. 1 to 5 and 11). It is thus apparent that, where a pipe with a large cross-sectional area is provided on its inner surface with a spiral groove or a longitudinally-extending straight groove, an improved cooling efficiency is realized as compared with a pipe with no grooves. It appeared that the depth and width of a groove had less influence on the cooling capability. The deeper the groove, the higher the cutting force, and thus a shallower groove is advantageous in this respect. The depth and width of a groove are subject to limitations by the wall thickness of the pipe to be used. The cross section of the groove is not restricted to a triangular shape and may be of any shape such as trapezoidal, circular, polygonal, square or the like, but the groove of triangular cross section may be advantageously formed with a common thread chaser.

In another embodiment, in place of grooves formed on the inner surface of a pipe with a large cross-sectional area, or along with such grooves, a mesh of metal such as copper or the like may be inserted into the pipe to obtain the same effect or advantage.

Figure 7A:
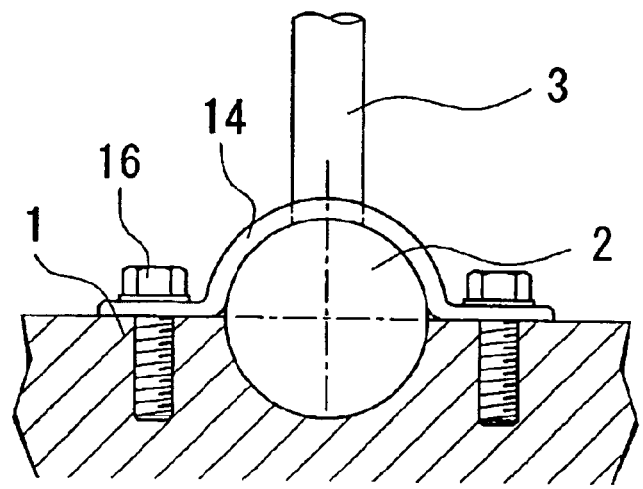
FIGS. 7A and 7B are views showing an example of a method of fixing a base block and a tank together where a pipe of circular cross section is used to constitute the tank.
Figure 7B:
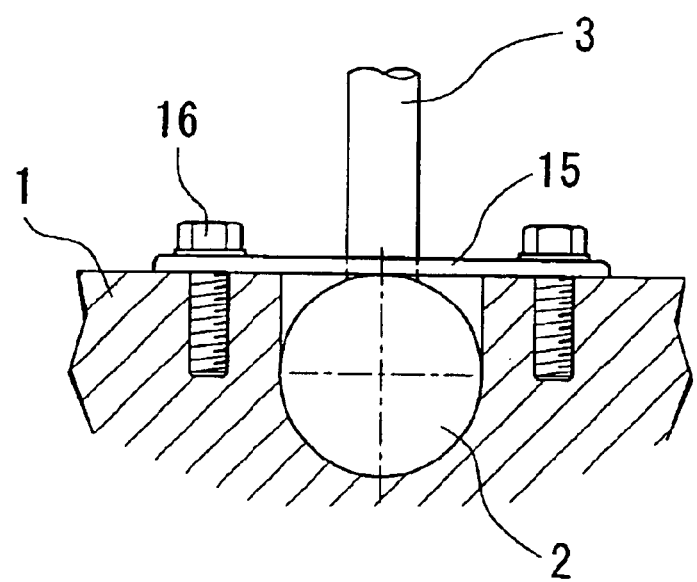

Furthermore, not only the pipe with a large cross-sectional area, but also the thin pipes 3 may be internally provided When a tank of circular cross section is used, as shown in FIG. 7A, a U-shaped mounting part 14 and screws 16 are preferably used to screw the tank 2 to the base block 1, so as to increase the strength. Furthermore, as shown in FIG. 7B, a plate-like mounting part 15 and screws 16 may also be used to screw and secure the tank 2 to the base block 1.

Figure 8:
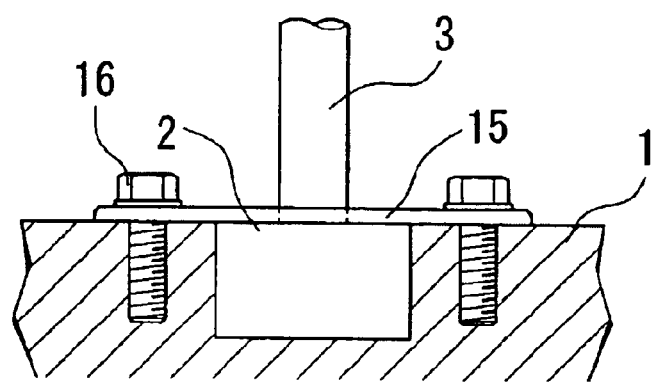
FIG. 8 is a view showing an example of a method of fixing a base block and a tank together where a pipe of square cross section is used to constitute the tank.

FIG. 8 shows an example of a method of securing a tank to the base block, the tank being constituted by a pipe of square cross section. Where the pipe of square cross section is used to constitute the tank, the maximum contact area between the tank 2 and the base block 1 will be obtained if the tank 2 is embedded in the base block 1 up to the top of its sides as shown in FIG. 8.

Likewise, where a tank of square cross section is used, as shown in FIG. 8, a plate-like mounting part 15 and screws 16 are preferably used to screw the tank 2 to the base block 1, so as to increase the strength.

The tank may be formed from a pipe produced through extrusion or may be formed from plates welded together.

In either case, the base block 1 and the tank 2 are preferably joined tightly together through welding at their joint from the viewpoint of thermal conductivity.

Figure 9:
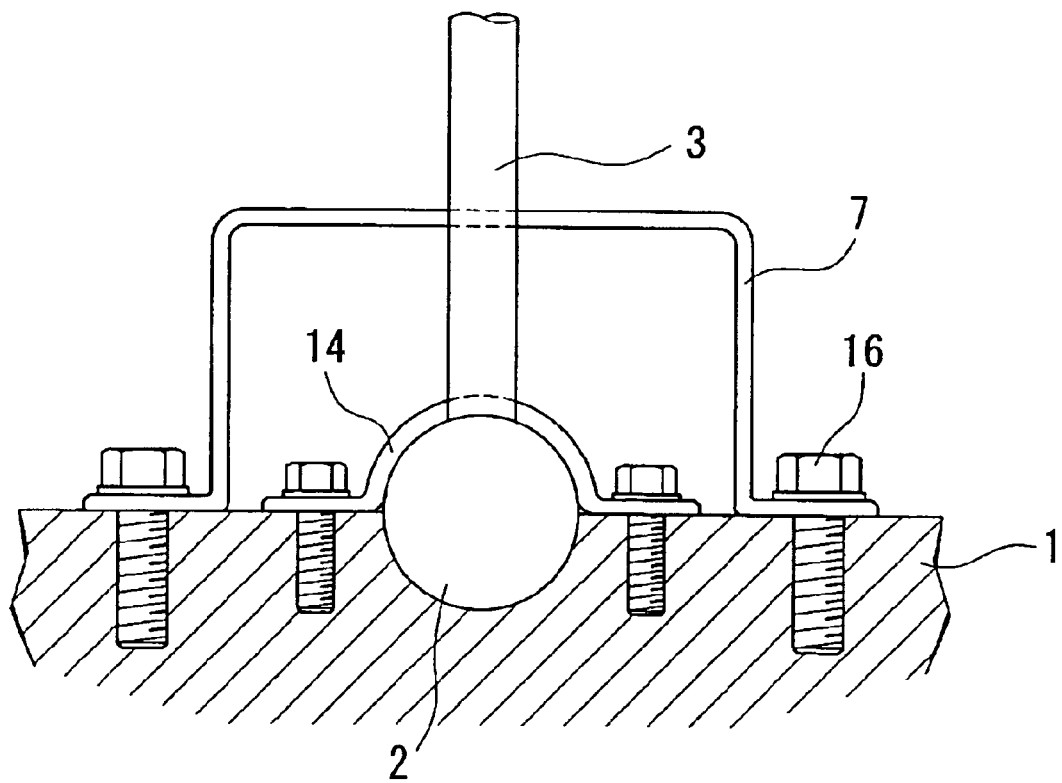
FIG. 9 is a view showing an example of a method of reinforcing each upstanding thin pipe.

Furthermore, it is preferable from the viewpoint of stability that each upstanding thin pipe is reinforced at an upper portion thereof with mounting hardware or the like. Examples of mounting hardware include a U-shaped mounting part 7 as shown in FIG. 9. As shown in FIG. 9, if the tank 2 and the thin pipes 3 are screwed to the base block 1 by using the mounting hardware 14 and 7, sufficient strength to enable withstanding vigorous vibrations will be obtained.

A heat pipe type heat exchanger according to a third embodiment of the present invention is comprised of a metal base block and a plurality of heat pipe units, with the tanks 2 of the latter embedded in a row in the base block. With such a heat pipe type heat exchanger, insofar as space is secured for the base block, any number of heat pipe units may be selected in accordance with the heat generated at the semiconductor device, making it possible to deal with a large capacity semiconductor device.

Figure 10:
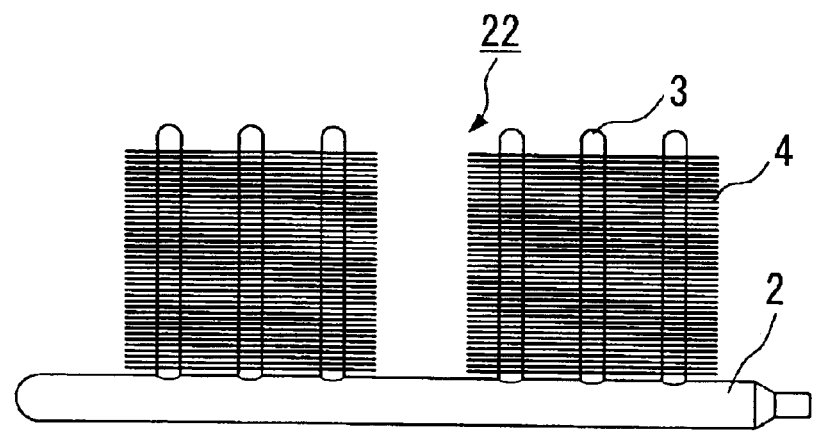
FIG. 10 is a side view of a heat pipe type heat exchanger according to a third embodiment of the present invention.
Figure 11:
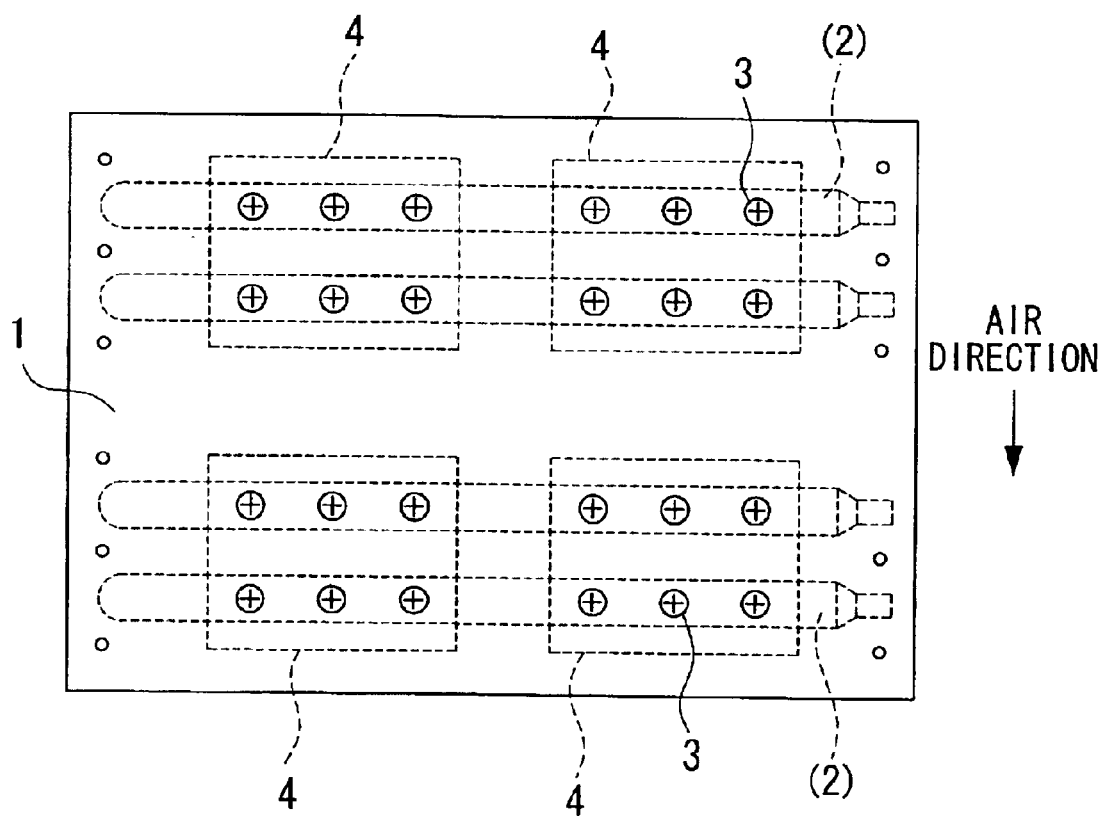
FIG. 11 is a top view showing the layout of the heat pipe type heat exchanger as shown in FIG. 10.

An example of a heat pipe type heat exchanger is shown in FIGS. 10 and 11, in which a plurality of heat pipe units 22 are embedded in a row in a metal base block 1. FIG. 10 is a side view and FIG. 11 is a top view showing the layout. In this example, four heat pipe units 22 are arranged in a row to be embedded in the base block 1. Two sets of fins 4, longitudinally divided with a spacing therebetween, are fitted over the thin pipes 3 of two neighboring heat pipe units. In the present embodiment, the thin pipes 3, when seen in top view, are arranged as a whole in a grid-like manner. The thus arranged heat pipe type heat exchanger is advantageously easier to produce than one in which the thin pipes are arranged in a staggered manner as will be described below.

Figure 12:
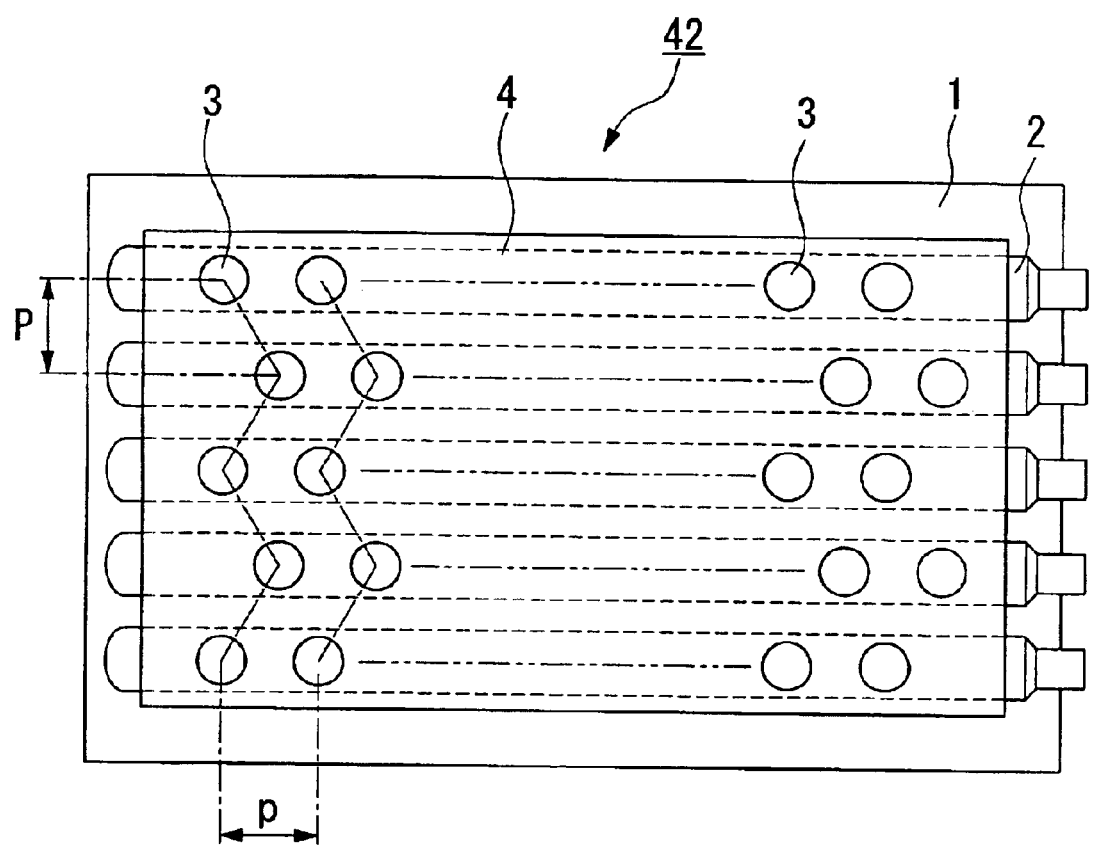
FIG. 12 is a top view showing the layout of the heat pipe type heat exchanger according to the third embodiment of the present invention.

A heat pipe type heat exchanger 42 according to the fourth embodiment of the present invention, is shown in top view in FIG. 12. This is another example of a heat pipe type heat exchanger comprised of a plurality of heat pipe units. In this heat pipe type heat exchanger 42, five heat pipe units are used, with their tanks 2 arranged in parallel and spaced uniformly.

In the present embodiment, the thin pipes 3 upstanding on the tank 2 of each heat pipe unit at a predetermined spacing, when seen in top view, are arranged in a staggered manner. If the thin pipes 3 are arranged in a staggered manner in top view, an improved cooling efficiency may be realized owing to the effect of turbulent flow. Although the fins 4 are mounted on all the thin pipes 3 in this example as shown in FIG. 12, they may be divided into several blocks and mounted on the relevant pipes 3.

Figure 13:
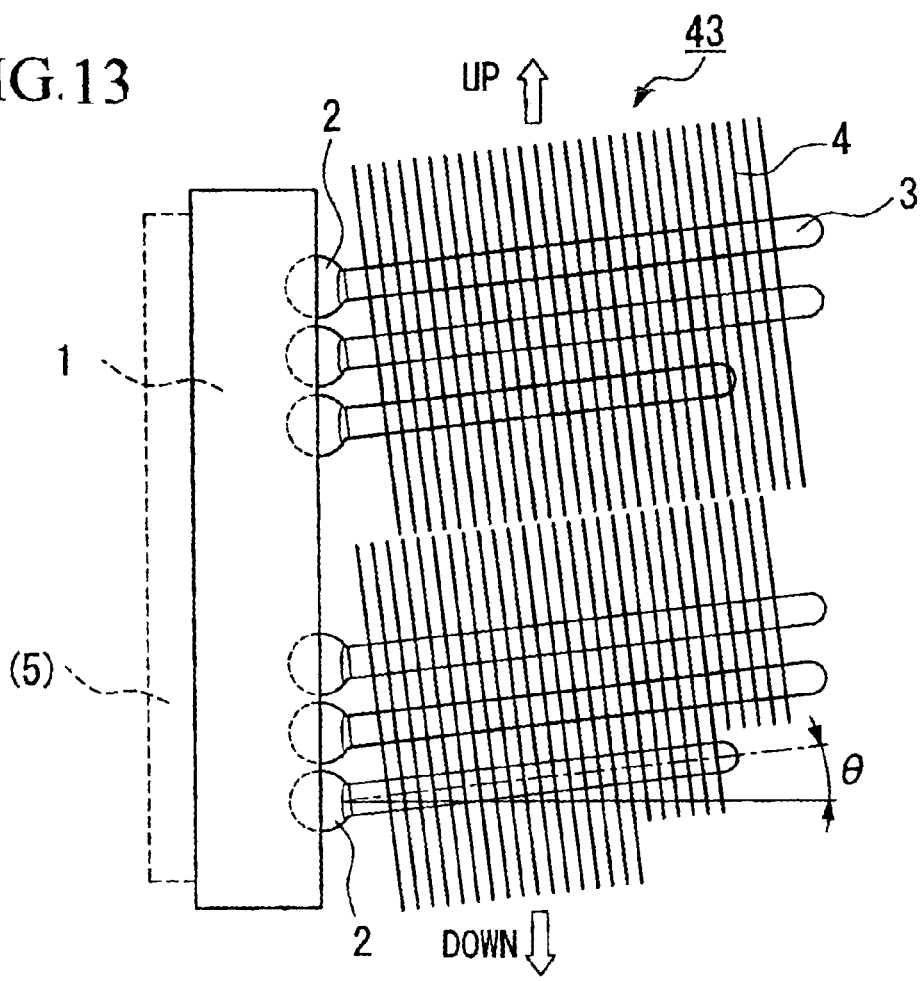
FIG. 13 is a side view of a heat pipe type heat exchanger according to a fourth embodiment of the present invention.
Figure 14:
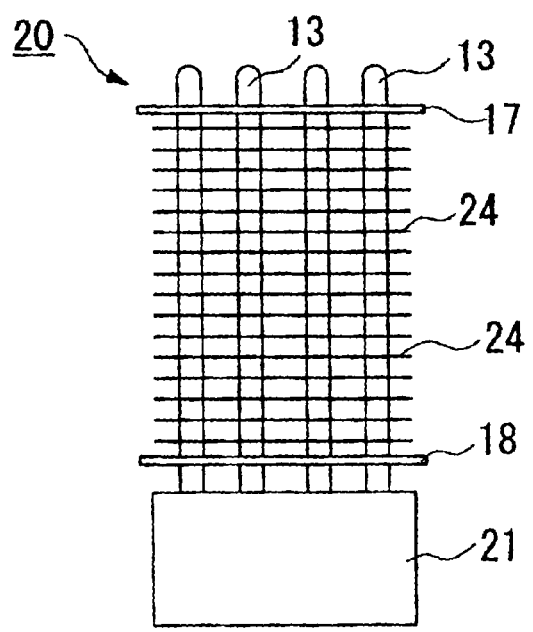
FIG. 14 is a perspective view of an example of a conventional heat pipe type heat exchanger.

A fifth embodiment of the present invention allows for a heat pipe type heat exchanger to be mounted vertically and is shown in FIG. 13.

With, for example, a vehicle-mounted semiconductor control device, there are cases where the mounting position of a heat pipe type heat exchanger is restricted and the heat exchanger must be installed vertically in a confined, vertically-extending space. In such cases, the base block 1 with the semiconductor device 5 joined thereto is mounted substantially vertically as shown in FIG. 13, and a plurality of tanks 2 are embedded in the base block 1 to extend in a horizontal direction. Each thin pipe 3 is joined to the corresponding heat pipe unit at an angle of $\theta°$ relative to the horizontal plane. The thus constructed heat pipe type heat exchanger 43 may be installed vertically in a confined space. The reason that each thin pipe 3 is inclined by $\theta°$ relative to the horizontal plane is to make it easier for the condensed liquid working fluid inside each thin pipe 3 to return to the corresponding tank 2. The angle $\theta$ is preferably in the range of 5 to 10°, and more preferably around 7°.

In the heat pipe unit of the present invention, a plurality of thin pipes are coupled to one another at their base with a tank such that each heat pipe evenly participates in the dissipation of heat. Furthermore, the heat pipe type heat exchanger of the present invention has a structure in which part of the tank of the heat pipe unit is embedded in a base block of large thermal capacity such that the dissipation of heat will be further accelerated.

The heat pipe unit and the heat pipe type heat exchanger of the present invention are simple in structure and easy to produce, and have a high thermal efficiency for their compact size.

Advantages of the Invention

The heat pipe unit of the present invention is simple in structure and is easy to produce, and has a good thermal efficiency. Furthermore, by increasing the number of heat pipe units as required, a heat pipe type heat exchanger may be constructed that is suited for cooling a semiconductor device of large heating value.

Having now fully described the invention, it will be apparent to one of ordinary skill in the art that many changes and modifications can be made thereto without departing from the spirit and scope of the invention as set forth in the attached claims.

What is claimed is:

1. A heat pipe unit comprising:
    a tank including a pipe of circular cross section, said pipe being provided with a groove on an inner surface thereof, and said groove being inclined at an angle $\theta$ of less than 90° relative to an axial direction of said tank and having a pitch of 4 mm or less in the axial direction of said tank;
    a plurality of pipes provided upstanding on and joined to a side of said tank to be in communication with said tank, said plurality of pipes being closed at an end thereof opposite an end where said plurality of pipes are joined to said tank;
    a working fluid sealed in said tank and movable between said plurality of pipes and said tank; and
    a plurality of fins each provided on said plurality of pipes.

2. The heat pipe unit according to claim 1, wherein said tank has a larger cross-sectional area than that of said plurality of pipes.

3. The heat pipe unit according to claim 1, wherein said groove has a depth of 0.01 mm to 0.5 mm.

4. The heat pipe unit according to claim 1, wherein said angle $\theta$ by which said groove is inclined relative to the axial direction of said tank is equal to or greater than 21.98° and less than 90°.

5. A heat pipe type heat exchanger comprising:
    a tank including a pipe of circular cross section, said pipe being provided with a groove on an inner surface thereof, and said groove being inclined at an angle $\theta$ of less than 90° relative to an axial direction of said tank and having a pitch of 4 mm or less in the axial direction of said tank;
    a plurality of pipes provided upstanding on and joined to a side of said tank to be in communication with said tank, said plurality of pipes being closed at an end thereof opposite an end where said plurality of pipes are joined to said tank;
    a working fluid sealed in said tank and movable between said plurality of pipes and said tank;
    a base block of metal having said tank embedded therein; and
    a plurality of fins each provided on said plurality of pipes.

6. The heat pipe type heat exchanger according to claim 5, wherein said tank has a larger cross-sectional area than that of said plurality of pipes.

7. The heat pipe type heat exchanger according to claim 5, wherein said groove has a depth of 0.01 mm to 0.5 mm.

8. The heat pipe type heat exchanger according to claim 5, wherein said tank is screwed to said base block with mounting hardware.

9. The heat pipe type exchanger according to claim 5, wherein said angle θ by which said groove is inclined relative to the axial direction of said tank is equal to or greater than 21.98° and less than 90°.

10. A heat pipe type heat exchanger comprising:
- a plurality of tanks, at least one of said plurality of tanks including a pipe of circular cross section, said pipe being provided with a groove on an inner surface thereof, and said groove being inclined at an angle θ of less than 90° relative to an axial direction of said tank and having a pitch of 4 mm or less in the axial direction of said tank;
- a plurality of pipes provided upstanding on and joined to a side of each of said tanks to be in communication with a corresponding one of said tanks, said plurality of pipes being closed at an end thereof opposite an end where said plurality of pipes are joined to a corresponding one of said tanks;
- a working fluid sealed in each of said tanks and movable between said plurality of pipes and the corresponding one of said tanks;
- a base block of metal having said plurality of tanks embedded therein; and
- a plurality of fins provided on at least some of said plurality of pipes of one or more of said plurality of tanks.

11. The heat pipe type heat exchanger according to claim 10, wherein said groove has a depth of 0.01 mm to 0.5 mm.

12. The heat pipe type heat exchanger according to claim 10, wherein said plurality of pipes of one or more of said plurality of tanks are arranged in top view in a grid-like manner or in a staggered manner.

13. The heat pipe type heat exchanger according to claim 10, wherein each of said tanks is screwed to said base block with mounting hardware.

14. The heat pipe type heat exchanger according to claim 10, wherein said angle θ by which said groove is inclined relative to the axial direction of said tank is equal to or greater than 21.98° and less than 90°.

15. A heat pipe type heat exchanger comprising:
- a tank including a pipe of circular cross section, said pipe being provided with a groove on an inner surface thereof, and said groove being inclined at an angle θ of less than 90° relative to an axial direction of said tank and having a pitch of 4 mm or less in the axial direction of said tank;
- a plurality of pipes provided upstanding on and joined to a side of said tank to be in communication with said tank, said plurality of pipes being closed at an end thereof opposite an end where said plurality of pipes are joined to said tank;
- a working fluid sealed in said tank and movable between said plurality of pipes and said tank;
- a base block of metal having said tank embedded therein; and
- a plurality of fins provided on said plurality of pipes,
- wherein said plurality of pipes are angled relative to said base block such that when said base block is mounted vertically, said plurality of pipes extend at an angle of 5° to 10° relative to a horizontal plane.

16. The heat pipe type heat exchanger according to claim 15, wherein said tank has a larger cross-sectional area than that of said plurality of pipes.

17. The heat pipe type heat exchanger according to claim 15, wherein said angle θ by which said groove is inclined relative to the axial direction of said tank is equal to or greater than 21.98° and less than 90°.

* * * * *